US006539508B1

(12) United States Patent
Patrie et al.

(10) Patent No.: US 6,539,508 B1
(45) Date of Patent: Mar. 25, 2003

(54) METHODS AND CIRCUITS FOR TESTING PROGRAMMABLE LOGIC

(75) Inventors: Robert D. Patrie, Scotts Valley, CA (US); Robert W. Wells, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/526,138

(22) Filed: Mar. 15, 2000

(51) Int. Cl.$^7$ .............................................. H04B 17/00
(52) U.S. Cl. ...................................... 714/726; 714/732
(58) Field of Search ................................ 714/726, 736, 714/724, 732, 725

(56) References Cited

U.S. PATENT DOCUMENTS

| | | | |
|---|---|---|---|
| 4,195,770 A | 4/1980 | Benton et al. ................ 371/21 |
| 4,300,234 A | 11/1981 | Maruyama et al. ........... 371/27 |
| 4,598,401 A | * 7/1986 | Whelan | |
| 4,841,525 A | 6/1989 | Lieske et al. ................. 371/21 |
| 4,942,576 A | 7/1990 | Busack et al. ............. 371/21.2 |
| 4,965,799 A | 10/1990 | Green et al. ............... 371/21.2 |
| 5,541,942 A | 7/1996 | Strouss ...................... 371/21.3 |
| 5,574,692 A | 11/1996 | Dierke ........................ 365/201 |
| 5,619,513 A | 4/1997 | Shaffer et al. ............. 371/25.1 |
| 5,659,549 A | 8/1997 | Oh et al. .................... 371/21.3 |
| 5,831,989 A | 11/1998 | Fujisaki .................... 371/21.6 |
| 5,889,413 A | 3/1999 | Bauer .......................... 326/40 |
| 5,914,616 A | 6/1999 | Young et al. ................. 326/41 |
| 6,452,459 B1 | * 9/2002 | Chan et al. | |

OTHER PUBLICATIONS

Xilinx Application Note by Peter Alfke, "Efficient Shift Registers, LFSR Counters, and Long Pseudo–Random Sequence Generators", XAPP052 (Version 1.1) Jul. 7, 1996, pp. 1–6.

Xilinx Application Note by Nick Camilleri "170 MHz FIFOs Using the Virtex Block SelectRAM+", XAPP131 (Version 1.1) Dec. 10, 1998, pp. 1–1 to 1–12.

Xilinx Application Note by Peter Alfke, "Megabit FIFO in Two Chips: One LCA Device and One DRAM", XAPP030.000 (Version 1.1), pp. 8–148 to 8–149.

Xilinx Application Note "Embedded Instrumentation Using XC9500 CPLDs", XAPP076 (Version 1.0), Jan., 1997 pp. 2–51 to 2–54.

Xilinx Application Note Advance Product Specification "Virtex ™2.5 V Field Programmable Gate Arrays", (Version 1.2), Jan. 27, 1999 pp. 3–3 to 3–50.

Ashok K. Sharma, "Programmable Logic Handbook PLDs, CPLDs and FPGAs", McGraw–Hill Copyright, 1998, Chapter 6, pp. 285–289.

* cited by examiner

Primary Examiner—Phung M. Chung
(74) Attorney, Agent, or Firm—Arthur Joseph Behiel (57) ABSTRACT

Described is a test circuit that can be instantiated on a programmable logic device to perform at-speed functional tests of programmable resources, including internal memory and routing resources. The resources to be tested are configured to instantiate a counter circuit connected to the address terminals of a linear-feedback shift register (LFSR). LFSRs are cyclic, in the sense that when clocked repeatedly they go through a fixed sequence of states. Consequently, an LFSR that starts with a known set of data has a predictable set of data after a given number of clock periods. The LFSR is preset to a known count and clocked a known number of times. The resulting count is then compared with a reference. If the resulting count matches the reference, then all of the resources used to implement the test circuit, including the memory and routing resources used to implement the LFSR, are deemed fully functional at the selected clock speed. A test circuit employing an LFSR can be duplicated many times on a given device under test to consume (and therefore test) as many resources as possible.

32 Claims, 11 Drawing Sheets

100 # METHODS AND CIRCUITS FOR TESTING PROGRAMMABLE LOGIC

FIELD OF THE INVENTION

This invention relates generally to methods and circuit configurations for testing integrated circuits, and in particular to methods and circuit configurations for testing the efficacy of memory cells and routing resources in programmable logic devices.

BACKGROUND

Programmable logic devices (PLDs) are a well-known type of digital integrated circuit (IC) that may be programmed by a user (e.g., a circuit designer) to perform specified logic functions. As with other types of ICs, PLDs are tested using some form of automatic test equipment (generally a "tester"). One type of PLD, the field-programmable gate array (FPGA), typically includes an array (rows and columns) of configurable logic blocks (CLBs) that are programmably interconnected to each other and to programmable input/output blocks (IOBs). The CLBs include memory arrays that can be configured either as look-up tables (LUTS) that perform specific logic functions or as random-access memory (RAM). Configuration data loaded into internal configuration memory cells on the FPGA define the operation of the FPGA by determining how the CLBs, interconnections, and IOBs are configured.

Circuit vendors must verify the speed performance and functionality of each device. Testing circuits for speed performance is difficult, as many signal paths within a given IC cannot be measured directly, leading to some speculation as to their true timing characteristics. This is particularly true of FPGAs, which use embedded memory for both logic and memory functions. Furthermore, testers have tolerances that can have a significant impact on some measurements, particularly when the signal propagation time of interest is short. For example, if the tester is accurate to one nanosecond and the propagation delay of interest is measured to be one nanosecond, the actual propagation delay might be any length of time between zero and two nanoseconds. Thus, IC manufacturers tend to add relatively large margins of error, or "guard bands," to ensure that their circuits will perform as advertised. Unfortunately, this practice means that those manufacturers are not able to guarantee their full speed performance, which can cost them customers in an industry where speed performance is paramount. There is therefore a need for a means of accurately characterizing the speed performance of programmable logic devices in general, and FPGAs in particular.

Functional testing of FPGAs includes exercising on-chip memory arrays to verify their data storage and retrieval capabilities. Memory testing requires more than simply writing and reading each memory location: various data patterns must be employed to ensure that each memory location is thoroughly tested. Executing such test patterns is time consuming and requires expensive test equipment, or "testers." It is therefore desirable to reduce or eliminate both the time required to test circuits and the need to employ expensive testers.

Field testing PLDs poses unique problems. A PLD programmed to perform some operation may malfunction like any IC. Unlike hard-wired ICs, however, a working PLD may include a defective resource that is not used to implement the current circuit configuration. The device may therefore work correctly until reconfigured to include some new circuitry that relies upon the defective resource. To make matters worse, different circuit configurations on a given device often have different critical paths, and may therefore exhibit different maximum clock speeds. PLDs should therefore be thoroughly tested before being reconfigured with a new design. Such testing is best performed without removing the PLD from the user's system, and preferably without the need for expensive and cumbersome test equipment. There is therefore a need for an inexpensive and effective means of field testing PLDs.

SUMMARY

The present invention satisfies the need for a means of effectively testing embedded memory cells and other IC resources, and further satisfies the need for an effective means of field testing programmable logic devices (PLDs). The present invention employs a test circuit that can be instantiated on a PLD to perform at-speed functional tests of PLD resources, including internal memory and routing resources. The resources to be tested are configured to create a counter circuit connected to the address terminals of a linear-feedback shift register (LFSR).

LFSRs are cyclic, in the sense that when clocked repeatedly they go through a fixed sequence of states. Consequently, an LFSR that starts with a known set of data contains a predictable set of data after a given number of clock periods. The fixed states of an LFSR are pseudo-random, with repetition rates that can be of virtually any length. The pseudo-random nature of LFSRS ensures that the internal memory and routing resources used to instantiate them are treated to a large number of permutations, provided that each LFSR is allowed to shift for a significant number of clock periods.

In accordance with the invention, an LFSR is preset to a known count (e.g., zero) and clocked a known number of times. The resulting count is then compared with a reference number. If the resulting count matches the reference number, then all of the resources used to implement the test circuit, including the memory and routing resources used to implement the LFSR, are deemed fully functional at the selected clock speed. If, however, the LFSR count does not match the reference number, then the test fails. The test can be run at a number of different speeds to determine the maximum clock speed for the device under test.

In accordance with one embodiment of the invention, a test circuit employing at least one LFSR is duplicated many times to consume as many programmable-logic resources as possible. The various test circuits are then run at a given clock speed to determine whether the tested resources function at that speed.

This summary does not purport to define the invention. The invention is defined by the claims.

DETAILED DESCRIPTION

Figure 1:
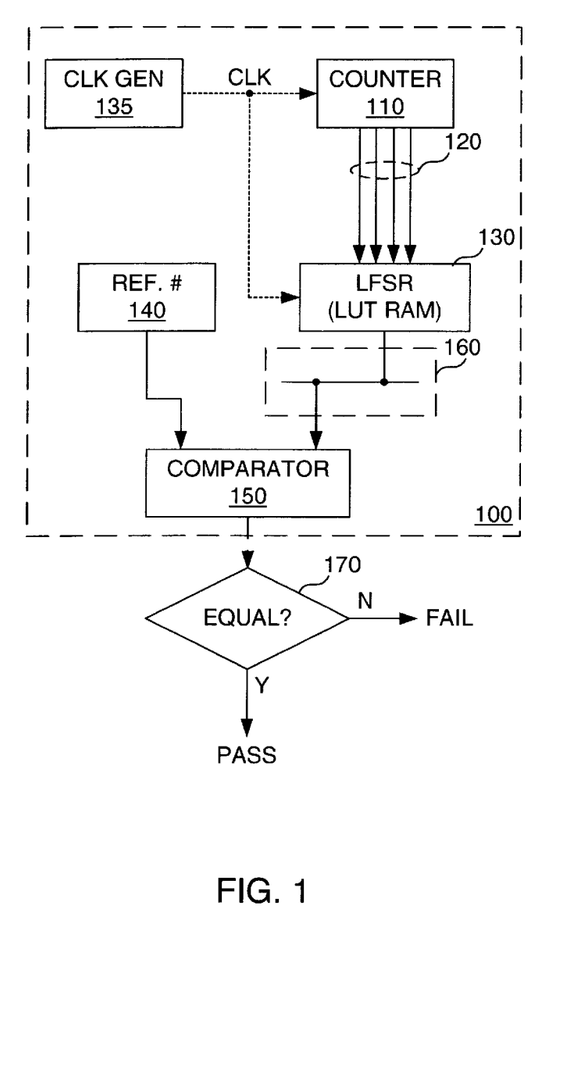
FIG. 1 depicts a test circuit 100 that can be used in accordance with the invention to perform at-speed functional tests of FPGA resources.

FIG. 1 depicts a test circuit 100 that can be used in accordance with the invention to perform at-speed functional tests of FPGA resources, including internal memory and routing resources. Test circuit 100 includes a counter 110 having output terminals 120 connected to the address terminals of a RAM array 130 configured as a linear-feedback shift register (LFSR). Test circuit 100 additionally includes a clock generator 135 configured to provide a clock signal on line CLK and a reference register 140 having an output terminal connected to an input terminal of a comparator 150. LFSR 130 connects to another input terminal of comparator 150 via routing resources 160.

LFSRs are cyclic, in the sense that when clocked repeatedly they go through a fixed sequence of states. Consequently, an LFSR that starts with a known set of data will contain a predictable set of data after a given number of clock periods. An incorrect set of data therefore indicates an error, possibly in the memory circuitry used to implement the LFSR.

The fixed states of an LFSR are pseudo-random, with repetition rates that can be of virtually any length, depending on the implementation. The pseudo-random nature of LFSR 130 ensures that the memory locations within LFSR 130 are treated to a large number of permutations if LFSR 130 is allowed to shift for a significant number of clock periods. Referring to decision block 170, if, after some number of clock transitions, the count provided to comparator 150 matches the correct reference number in register 140, then all of the resources used to implement test circuit 100 are deemed fully functional at the selected clock speed. If, however, the LFSR count does not match the count in register 140, then the test fails. The test can be run at a number of different speeds to determine the maximum clock speed for a device under test.

Figure 2:
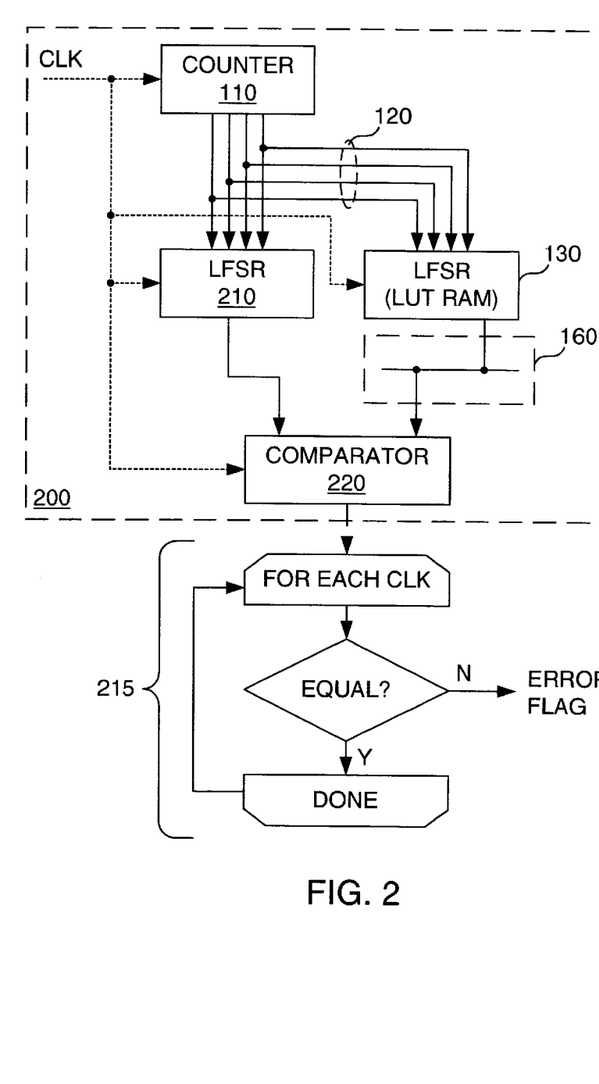
FIG. 2 depicts a test circuit 200 in accordance with another embodiment of the invention.

FIG. 2 depicts a test circuit 200 in accordance with another embodiment of the invention. Test circuit 200 is in some ways similar to test circuit 100 of FIG. 1, like-numbered elements being the same. Test circuit 200 additionally includes a second LFSR 210 also connected to output terminals 120 of counter 110. LFSR 210 is configured to produce the same output pattern as LFSR 130, so that the final results and each intermediate value from LFSR 130 and LFSR 210 should match after each clock cycle. As indicated in flowchart 215, test circuit 200 indicates an error if the output of a synchronous comparator 220 indicates a mismatch after any clock cycle.

LFSR 130 is implemented using on-chip memory to test the functionality of that memory. The remaining components, including the various interconnections between LFSR 210, counter 110, clock generator 135, and comparators 150 and 220, can also be implemented using FPGA resources. Thus configured, a passing test sequence on either of test circuits 100 or 200 indicates correct function, at speed, for all of the FPGA resources used in the test.

Figure 3:
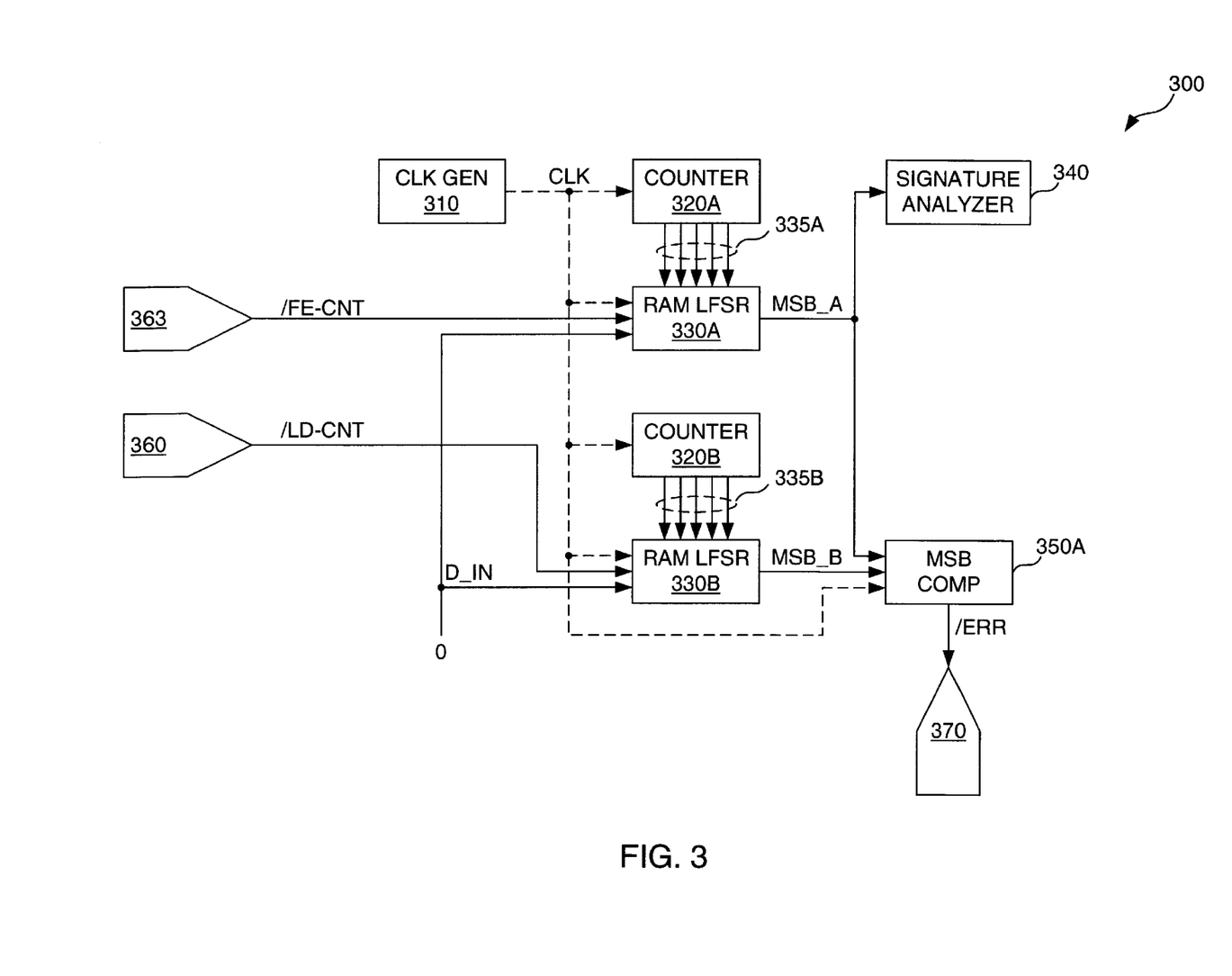
FIG. 3 depicts a test circuit 300 in accordance with yet another embodiment of the invention.

FIG. 3 depicts a test circuit. 300 in accordance with yet another embodiment of the invention. Test circuit 300 is specifically adapted for testing FPGAs in the Virtex family available from Xilinx, Inc., of San Jose, Calif. Test circuit 300 includes a clock generator 310 connected to a pair of counters 320A and 320B and a respective pair of RAM LFSRs 330A and 330B. Counters 320A and 320B are connected to respective RAM LFSRS 330A and 330B via buses 335A and 335B. Test circuit 300 additionally includes a signature analyzer 340 and a most-significant-bit (MSB) comparator 350A. These circuit components are externally accessible via a number of input and output pins depicted as flag-shaped circuit nodes. (In the present specification, the same reference characters are used to refer to pins, nodes, signal lines, and their corresponding signals.)

A clock line CLK from clock generator 310 connects to each of counters 320A and 320B, LFSRs 330A and 330B, and MSB comparator 350A. A load/count signal /LD-CNT on pin 360 can be externally set to logic zero (e.g., zero volts) to transfer data on a data line D_IN into LFSR 330B. Similarly, a force-error/count signal /FE-CNT on pin 363 is used to transfer data on data line D_IN into LFSR 330A. As discussed below, the force-error/count signal /FE-CNT on pin 363 allows an external tester to verify that the test circuit 300 correctly flags errors.

In the depicted embodiment, line D_IN is tied to a logic zero (e.g., zero volts); in other embodiments, line D_IN is externally accessible, allowing an external tester to load desired data patterns into LFSRs 330A and 330B. Once each of LFSRs 330A and 330B are loaded, load/count pin 360 and force-error/count pin 363 are set to logic ones, thereby allowing LFSRs 330A and 330B to count through a pseudo-random sequence.

The most-significant bit of LFSR 330A connects to each of signature analyzer 340 and MSB comparator 350A via a line MSB_A; the most-significant bit of LFSR 330B connects to MSB comparator 350A via a line MSB_B. Both LFSRs are configured the same, and should therefore generate the same pseudo-random sequence of most-significant bits. MSB comparator 350A compares the most-significant bit of each LFSR after each active clock edge to ensure that both LFSRs step through the same sequence. MSB comparator 350A flags any mismatch between the signals on lines MSB_A and MSB_B by providing a logic zero on an external pin 370. Such an error indicates that the FPGA resources used to instantiate test circuit 300 do not function properly at the selected clock frequency.

Signature analyzer 340 is, in one embodiment, a seventeen-bit LFSR counter with a clock terminal connected to line MSB_A. Because LFSR 330A runs through a deterministic sequence, line MSB_A should transition between one and zero a certain number of times for a given number of transitions on clock line CLK. Signature analyzer 340 therefore indicates an error if the count stored in signature analyzer 340 does not indicate the correct number of signal transitions. The later discussion of FIG. 9 details one embodiment of signature analyzer 340.

Force-error pin 363 enables an external tester to determine whether test circuit 300 will flag an error if the output of RAM LFSR 330A differs from that of RAM LFSR 330B. Such a test is performed by leaving input pin 363 low and bringing pin 360 high. LFSR 330B will therefore increment, while LFSR 330A merely repetitively loads zeros. The respective most-significant bits MSB_A and MSB_B will eventually fail to match, a condition that should result in an error flag (i.e., a logic zero on pin 370). Further, LFSR 330A's failure to count should cause signature analyzer 340 to contain the wrong count. Pin 363 can thus be employed to ensure that test circuit 300 is capable of noting errors.

Figure 4:
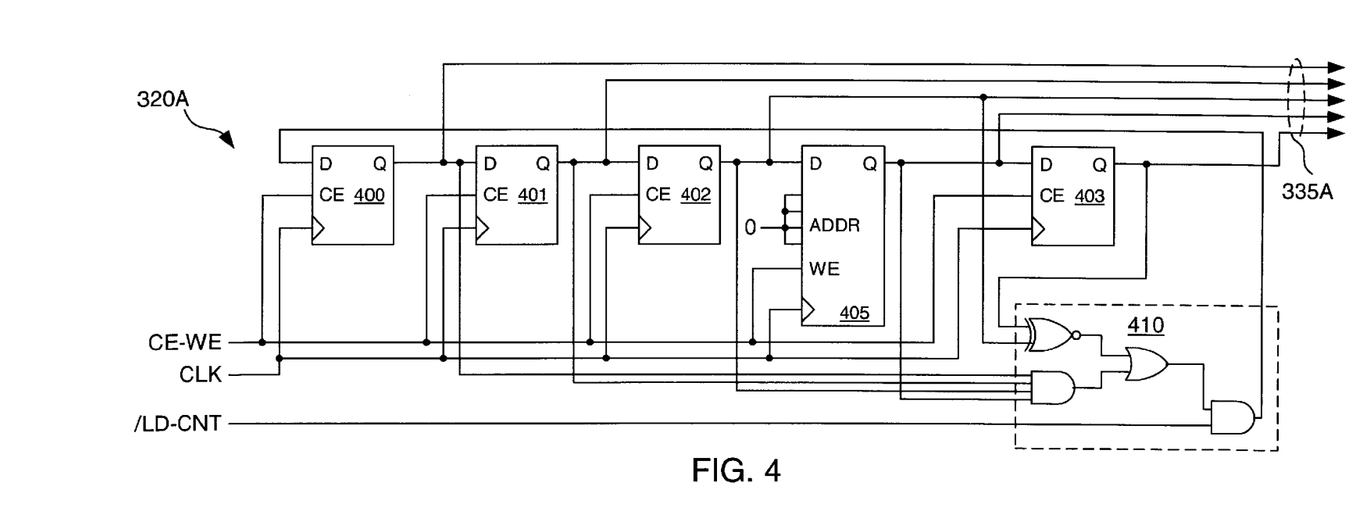
FIG. 4 schematically depicts counter 320A of FIG. 3.

FIG. 4 schematically depicts counter 320A of FIG. 3 (counter 320B is identical). Counter 320A can be any type of synchronous counter, but is configured as an LFSR in the depicted embodiment because LFSRs are very fast and require fewer resources than other counters of comparable size. Counter 320A includes four D flip-flops 400–403 and a 16×1 RAM 405. Each address line of RAM 405 is tied to a logic zero. Thus configured, RAM 405 acts as a one-bit storage element similar to flip-flops 400–403. This configuration is used to ensure that counter 320A packs efficiently into Virtex FPGAs.

Counter 320A includes a feedback circuit 410 with the requisite logic to preset counter 320A and to provide a feedback signal to flip-flop 400 so that counter 320A operates as an LFSR. Line /LD-CNT can be the same as or different from the like-named line of FIG. 3. (Note that FIG. 3 does not show signal /LD-CNT ass an input to counter 320A, because some embodiments of counter 320A do not use signal /LD-CNT.) Clocking counter 320A while line /LD-CNT is a logic zero loads counter 320A with zeros; clocking counter 320A while line /LD-CNT is a logic one causes counter 320A to count through each of the 32 possible combinations of five binary digits. Bus 335A conveys these states to LFSR 330A.

For a detailed description of LFSRs and how to implement them using FPGAs, see the Xilinx application note entitled "Efficient Shift Registers, LFSR Counters, and Long Pseudo-Random Sequence-Generators," by Peter Alfke, XAPP 052 Jul. 7, 1996 (Version 1.1), which is incorporated herein by reference.

Figure 5:
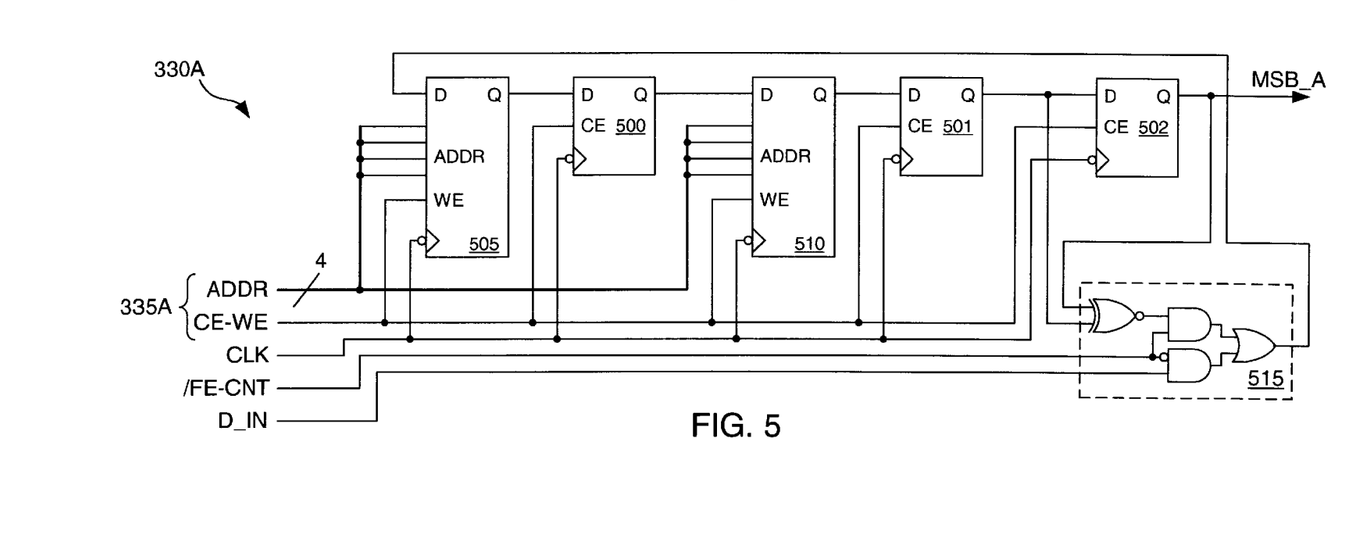
FIG. 5 schematically depicts LFSR 330A of FIG. 3.

FIG. 5 schematically depicts an embodiment of LFSR 330A of FIG. 3 (LFSR 330B is identical to LFSR 330A, except that line /FE-CNT in FIG. 5 connects instead to line /LD-CNT of FIG. 3). LFSR 330A includes three D flip-flops 500–502 and two 16×1 RAM arrays 505 and 510. Each address line of RAM arrays 505 and 510 is tied to a respective line from counter 320A on bus 335A (it does not matter which address line connects to which line of bus 335A). The remaining line from bus 335A connects to respective write-enable and clock-enable terminals of the various flip-flops and RAM arrays via a line CE-WE. The sense of each clock terminal of flip-flops 500–502 and RAM arrays 505 and 510 is inverted to allow the signals from bus 335A time to settle before LFSR 330A is clocked.

RAM arrays 505 and 510 each act as sixteen one-bit storage elements. Flip-flops 500–502 are also one-bit storage elements. LFSR 330A is therefore a 35-bit LFSR. 35-bit LFSRs can have billions of states, so LFSR 330 will not repeat for a very long time, even at relatively high clock frequencies. Consequently, each bit of LFSR 330A provides a non-repeating, pseudo-random sequence of ones and zeroes during a test period. The most-significant bit of LFSR 330A (or any other bit) is conveyed to MSB comparator 350A (FIGS. 3 and 6) on line MSB_A for comparison with the same bit from LFSR 330B. LFSR 330A includes a feedback circuit 515 with the requisite logic to preset LFSR 330A with data from terminal D_IN (e.g., all zeros) and to provide feedback signals to RAM array 505 so that the RAM arrays and flip-flops operate as an LFSR.

Figure 6:
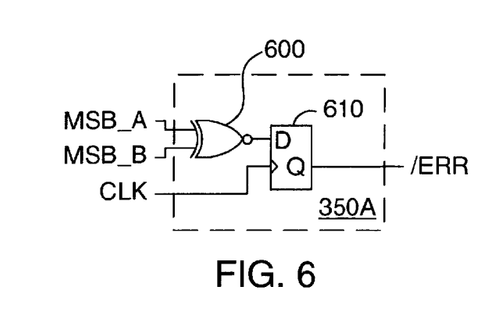
FIG. 6 schematically depicts an example of MSB comparator 350A of FIG. 3.

FIG. 6 schematically depicts an embodiment of MSB comparator 350A of FIG. 3. Comparator 350A includes an XNOR gate 600 and a D flip-flop 610. The Q output of flip-flop 610 is preset to logic one. Comparator 350A compares the logic levels on lines MSB_A and MSB_B. Any mismatch between the signals on lines MSB_A and MSB_M produces a logic zero that is stored in flip-flop 610 and presented on error line /ERR. As with other gates depicted in the figures, XNOR gate 600 may be implemented using FPGA logic resources, as will be understood by those of skill in the art.

Figure 7:
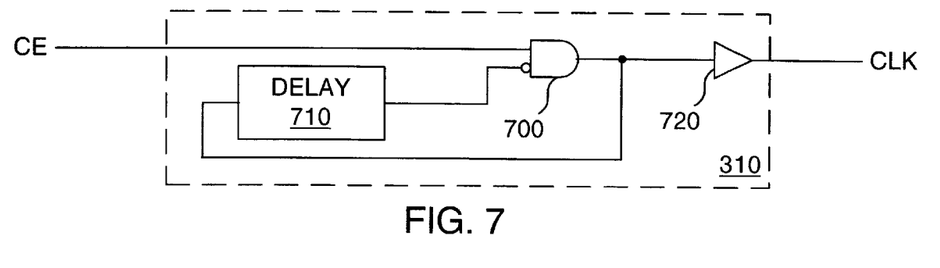
FIG. 7 depicts an example of clock generator 310 of FIG. 3.

FIG. 7 depicts an example of clock generator 310 of FIG. 3. Clock generator 310 includes an AND gate 700, a non-inverting delay element 710, and a buffer 720. AND gate 700 acts as a simple inverter when the clock enable signal CE is a logic one, so that delay element 710 and AND gate 700 form a ring oscillator. Delay element 710 can include any resource that produces a desired delay, a chain of look-up tables and interconnect resources, for example. Clock generator 310 can be implemented entirely on-chip, and is therefore useful for field diagnostics. In one embodiment implemented on a Virtex FPGA, delay element 710 is a chain of twelve buffers.

Figure 8:
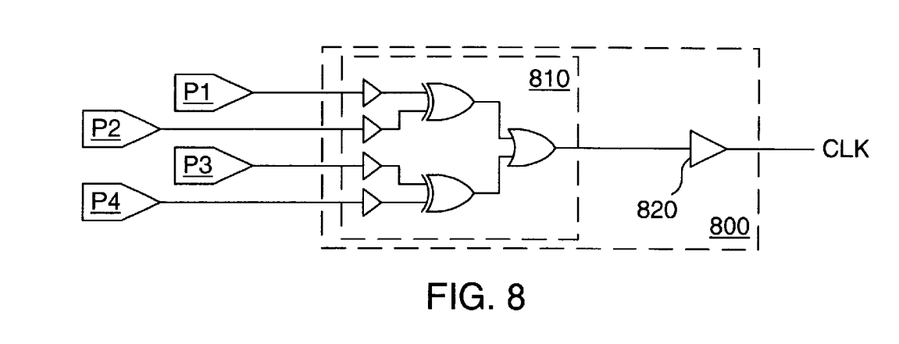
FIG. 8 depicts clock generator 800 for use in the present invention.

FIG. 8 depicts another type of clock generator 800 for use in the present invention. Clock generator 800 includes a clock-pulse generator 810 and a buffer 820. Clock-pulse generator 810 uses four external clocks on pins P1-P4, each with a different amount of delay with respect to one another, to produce an output clock of higher frequency then the external clocks. Thus, for example, four clocks from a 50 MHz tester can be combined to create a single 200 MHz clock on line CLK. A conventional tester typically provides the external clock signals.

In another embodiment, the clock signal CLK is generated off-chip, rather than by clock generator 800.

Figure 9:
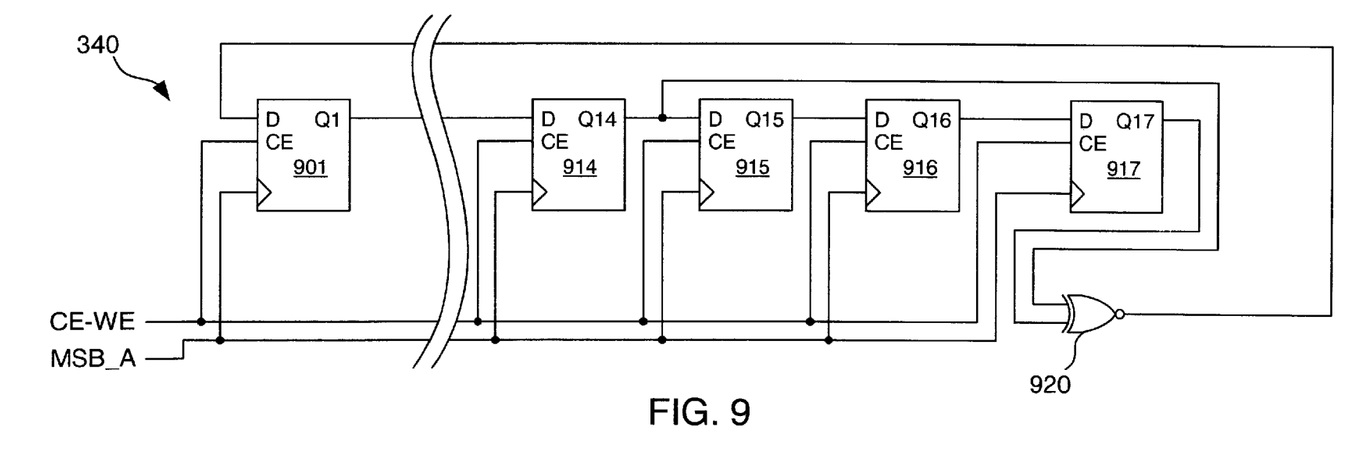
FIG. 9 depicts an exemplary embodiment of signature analyzer 340 of FIG. 3.

FIG. 9 depicts an embodiment of signature analyzer 340 of FIG. 3. Signature analyzer 340 can be any suitable signature analyzer, but is an LFSR in the embodiment of FIG. 9. Signature analyzer 340 includes seventeen D flip-flips 901–917 (flip-flops 902–913 are omitted from FIG. 9 for simplicity). An XNOR gate 920 provides the requisite feedback to configure signature analyzer 340 as an LFSR. Before running a test, signature analyzer 340 is reset using a set/reset line SR (FIG. 14) connected to each flip-flop. Then, during a subsequent test, signature analyzer 340 clocks once for each zero-to-one signal transition on line MSB_A from LFSR 330A. Because LFSR 330A runs through a deterministic sequence, line MSB_A should transition between one and zero a certain number of times for a selected number of transitions on clock line CLK. Signature analyzer 340 therefore indicates an error if the count stored in signature analyzer 340 does not correspond to the correct number of signal transitions. The correct number of transitions can be determined by simulating test circuit 300 (FIG. 3) for the selected number of clock periods.

Using a seventeen-bit LFSR assures that the pattern generated by signature analyzer 340 will not soon repeat.

Also, as noted above, LFSRs are useful counters because they are relatively fast and require relatively low overhead. In one embodiment, flip-flops 901–917 are output flip-flops in the IOBs of an FPGA under test. If necessary, the flip-flops can be placed in unbonded sites so that switching signals do not affect external pins.

Figure 10:
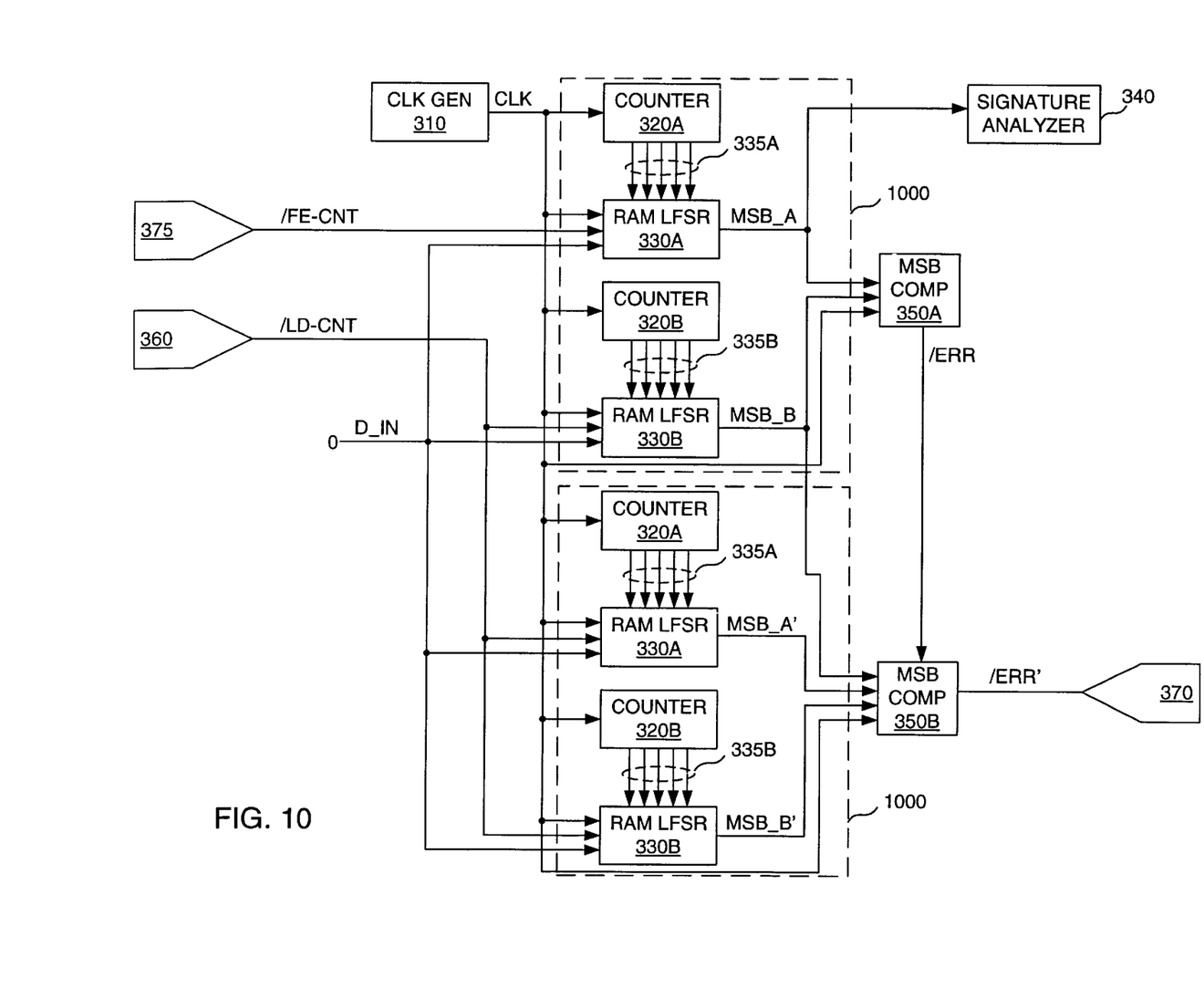
FIG. 10 illustrates how test circuit 300 of FIG. 3 can be scaled to test many resources on a given FPGA.

FIG. 10 shows how test circuit 300 of FIG. 3 can be scaled to test additional resources on a given FPGA. This scaling is accomplished by duplicating a portion of test circuit 300—labeled 1000 in FIG. 10—as many times as necessary. Portion 1000 includes counters 320A and 320B and LFSRs 330A and 330B. One instance of portion 1000 connects MSB comparator 350A; the remaining one or more portions 1000 use a slightly different MSB comparator 350B, which is described below in connection with FIG. 11.

Each instance of portion 1000 is arranged in series, such that the MSB comparator associated with each downstream instance compares each line MSB_A and MSB_B of that instance with MSB_B of the preceding instance. In the depicted example, MSB comparator 350B compares the signals on lines MSB_A and MSB_B of the second instance—labeled MSB_A' and MSB_B', respectively—with each other and with the signal on line MSB_B of the first instance. Any mismatch between or within instances results in an error flag (e.g., a logic zero) on error pin 370. Incidentally, there need be only one signature analyzer 340, because comparator circuits 350A and 350B ensure that the outputs of each RAM LFSR match.

Figure 11:
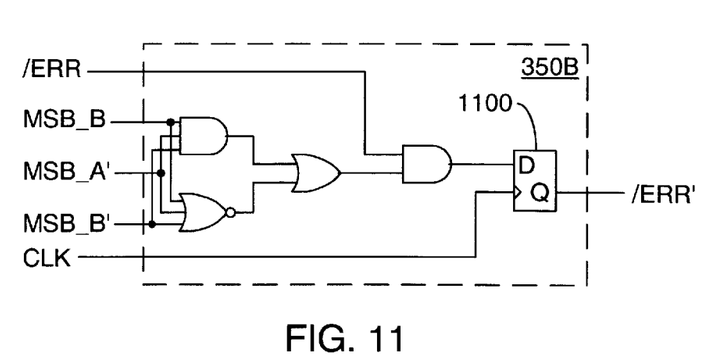
FIG. 11 details MSB comparator 350B of FIG. 10.

FIG. 11 details MSB comparator 350B first introduced in FIG. 10. MSB comparator 350B includes a collection of gates and a flip-flop 1100 preset to logic one. MSB comparator 350B compares the signal on each line MSB_A' and MSB_B' of that instance with MSB_B of the preceding instance. Any mismatch between or within instances results in an error flag (e.g., logic zero) on the error line /ERR' extending from the MSB comparator. Each MSB comparator 350B also receives the error signal from a previous MSB comparator on line /ERR. Thus, errors reported by upstream comparators propagate through the test circuit, eventually to be reported on an external pin.

Figure 12:
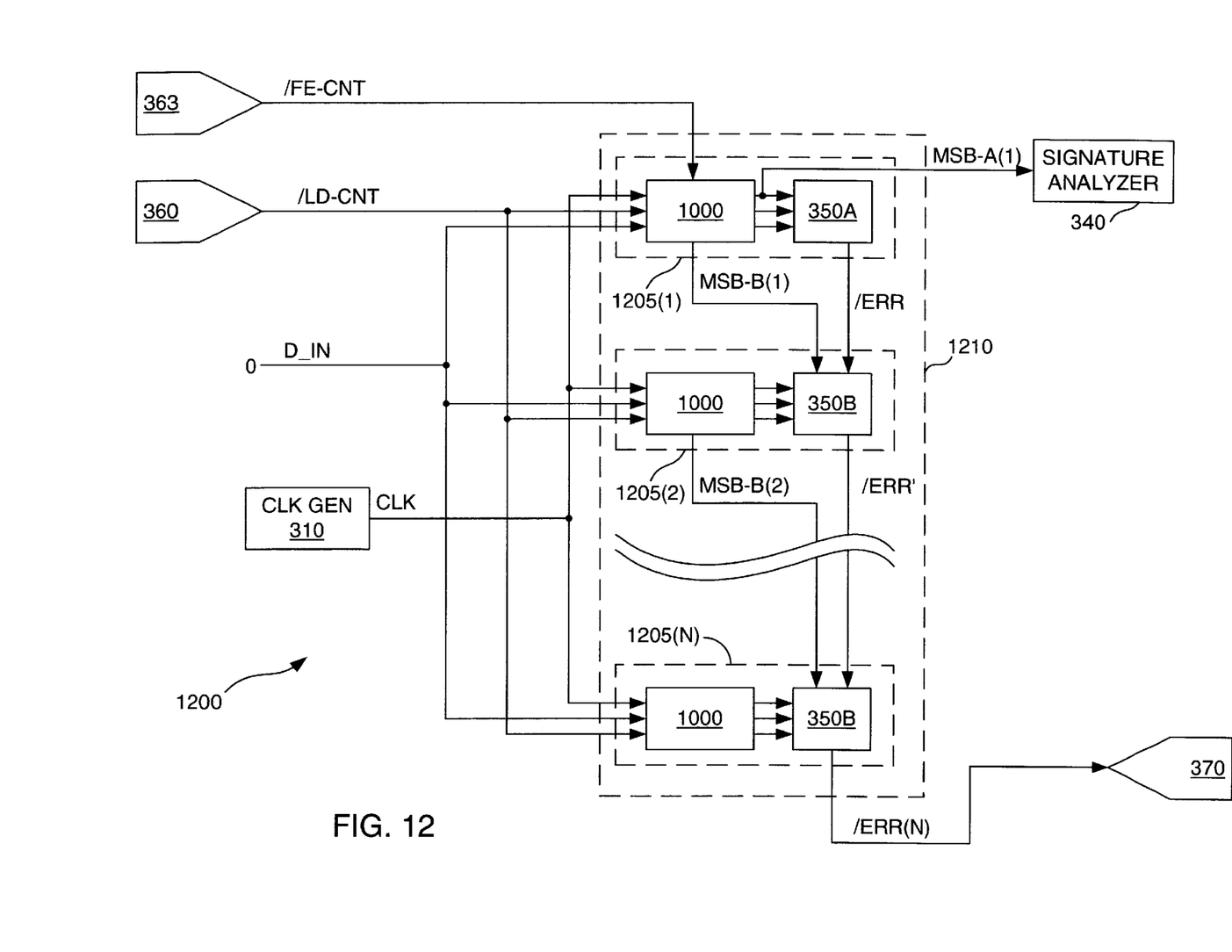
FIG. 12 schematically depicts a test circuit 1200 that includes N minor test circuits 1205(1)–1205(N).

FIG. 12 schematically depicts a test circuit 1200 that includes N minor test circuits 1205(1)–1205(N), each comprised of a circuit portion 1000 and an associated MSB comparator (see FIG. 10). When test circuit 1200 is instantiated in Virtex FPGAs, each minor test circuit 1205(1–N) occupies four CLBs. Each member of the Virtex family includes an array of CLBs with an even number of rows R and an even number of columns C. In one embodiment, test circuit 1200 is extended to fill two columns of a Virtex FPGA using R/2 instances. Minor test circuits 1205(1)–1205(N) are collectively termed a "column" instance 1210.

Figure 13:
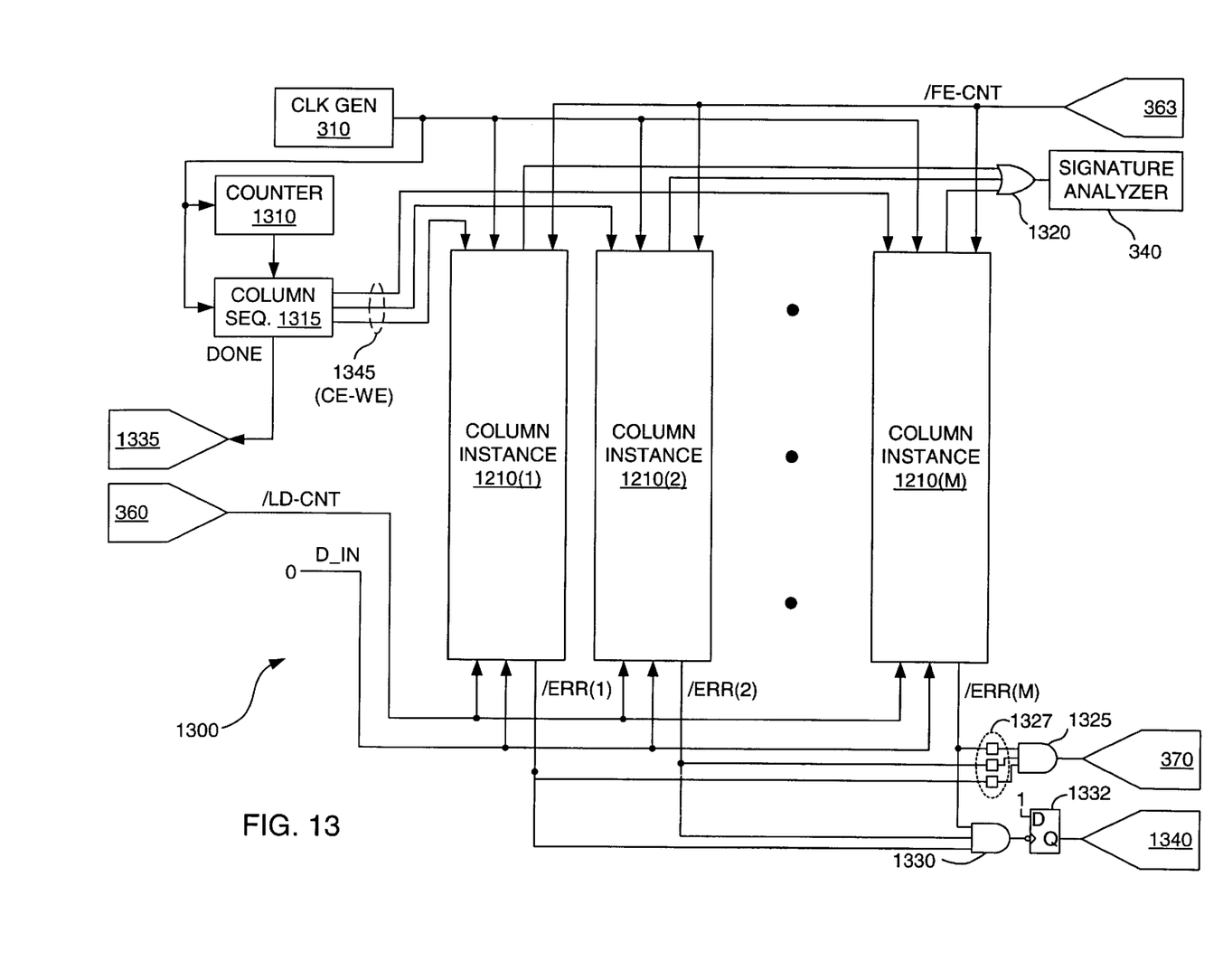
FIG. 13 schematically depicts a test circuit 1300 that employs M column instances 1210(1)–1210(M) to populate every row and column of an FPGA.

FIG. 13 schematically depicts a test circuit 1300 that employs M column instances 1210(1)–1210(M) to populate every row and column of a Virtex FPGA. As discussed above, each member of the Virtex family includes an even number C of columns, and each column instance 1210 occupies two columns. Thus, C/2 column instances can be used to populate an entire Virtex FPGA.

Test circuit 1300 includes a number of circuit elements in common with test circuits 300 and 1200 of FIGS. 3 and 12, respectively, like-numbered elements being the same. Test circuit 1300 additionally includes circuitry that sequences through each column instance and indicates an error if any column instance generates an error signal on respective error lines /ERR(1)-/ERR(M).

The additional common circuitry includes a counter 1310, a column sequencer 1315, an M-input OR gate 1320, an M-input AND gate 1325 preceded by a collection of M ones catchers 1327, an M-input AND gate 1330 followed by a ones catcher 1332, and output pins 1335 and 1340. Each ones catcher in collection 1327 is identical to ones catcher 1332. Column sequencer 1315 can be, for example, a conventional one-hot register with a single memory location connected to each column instance 1210(1) through 1210(M) via respective ones of lines 1345. Counter 1310 counts up to some number of clock cycles sufficient to test one column instance before clocking column sequencer 1315. Sequencer 1315 cycles a single logic one from one register to the next, thus enabling each column instance in turn. Once each column instance has been tested, column sequencer 1315 stops counting and issues a logic one online DONE to external pin 1335.

In one embodiment instantiated on a Virtex FPGA, each element of the common circuitry is implemented using IOB resources. This implementation advantageously allows the CLBs to be populated using sets of identical circuits. In another embodiment, the common circuitry is implemented using resources external to the FPGA. Yet another embodiment dispenses with counter 1310 and column sequencer 1315, relying instead on external controls to provide the equivalent functionality. Ones catcher 1332 and identical ones catchers 1327 capture error signals and hold them on external pins 1340 and 370.

Figure 14:
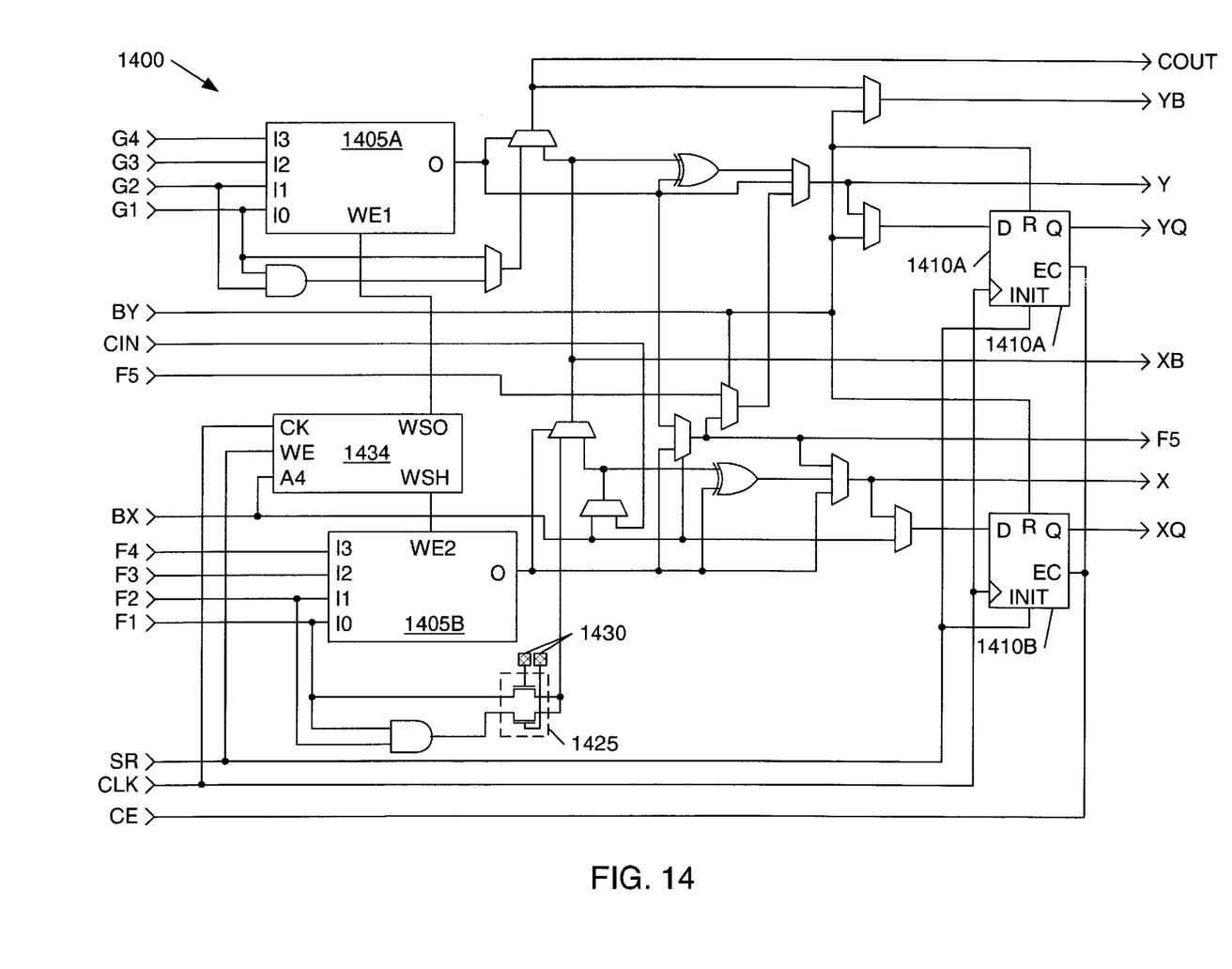
FIG. 14 is a schematic diagram of a "slice" 1400, one of two identical slices that make up an exemplary CLB in the Virtex™ family of devices available from Xilinx, Inc.
Figure 15A:
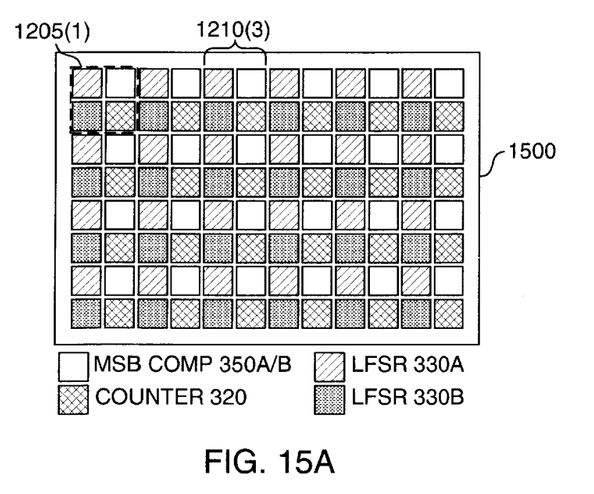
FIGS. 15A–15D depict four FPGA configurations for instantiating test circuit 1300 of FIG. 13 on an exemplary FPGA 1500.
Figure 15B:
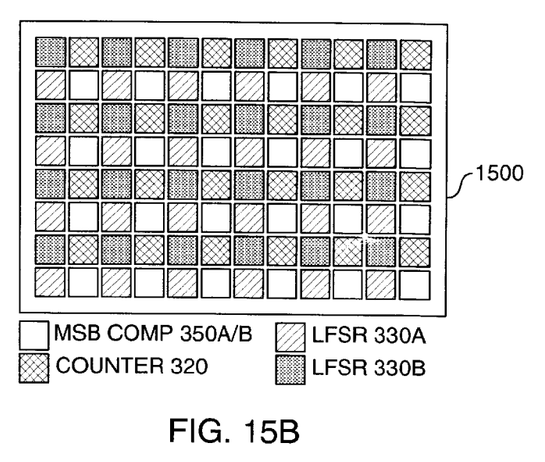
Figure 15C:
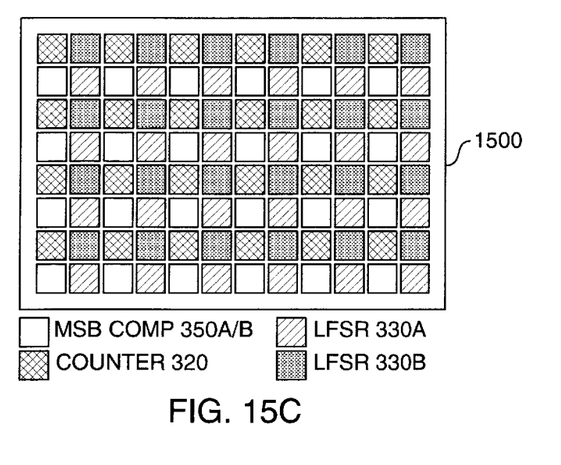
Figure 15D:
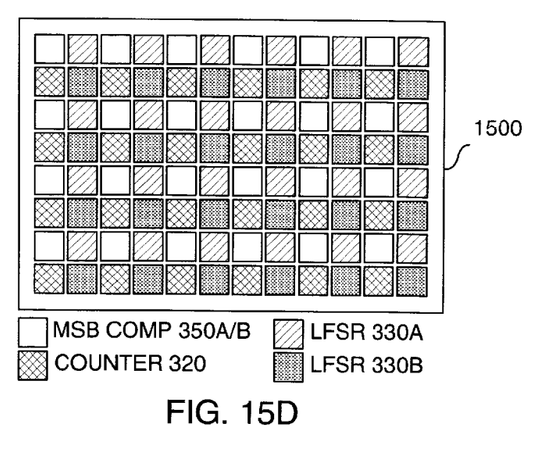

FIG. 14 is a schematic diagram of a "slice" 1400, one of two identical slices that make up an exemplary CLB in the Virtex family of devices available from Xilinx, Inc. All of the terminals to and from slice 1400 are connected to horizontal or vertical interconnect lines (not shown) through which they can be programmably connected to various other components within the FPGA.

Slice 1400 includes two 4-input look-up tables (LUTs) 1405A and 1405B. LUTs 1405A and 1405B are each capable of implementing any arbitrarily defined Boolean function of up to four inputs. In addition, each of LUTs 1405A and 1405B can provide a 16×1-bit synchronous RAM. Furthermore, the two LUTs can be combined to create a 16×2-bit or 32×1-bit synchronous RAM, or a 16×1-bit dual-port synchronous RAM.

Slice 1400 also includes a pair of sequential storage elements 1410A and 1410B that can be configured either as edge-triggered D-type flip-flops or as level-sensitive latches. The D inputs can be driven either by LUTS 1405A and 1405B or directly from input terminals, bypassing LUTs 1405A and 1405B. Each storage element includes an initialization terminal INIT, a reverse-initialization terminal R, an enable-clock terminal EC, and a clock terminal conventionally designated using the symbol ">". The INIT terminal forces the associated storage element into an initialization state specified during configuration; the reverse-initialization terminal R forces the storage element into the opposite state as the INIT terminal. Terminals INIT and R can be configured to be synchronous or asynchronous, and the sense of each control input can be independently inverted.

Configuration memory cells define the functions of the various *configurable elements of slice 1400. An exemplary two-input multiplexer 1425 includes a pair of MOS transistors having gate terminals connected to respective configuration memory cells 1430. Other configuration memory cells used to define the functions of the remaining programmable elements of slice 1400 are omitted for brevity. The use of configuration memory cells to define the function of programmable logic devices is well understood in the art.

A detailed discussion of slice 1400 is not necessary for understanding the present invention, and is therefore omitted for brevity. For a more detailed treatment of the operation of many components within slice 1400, see U.S. Pat. No. 5,889,413 entitled "Lookup Tables Which Double as Shift Registers," by Bauer, and U.S. Pat. No. 5,914,616 entitled "FPGA Repeatable Interconnect Structure with Hierarchical Interconnect Lines," by Steven P. Young, et al. Each of the foregoing documents is incorporated herein by reference.

FIGS. 15A–15D depict four FPGA configurations for instantiating test circuit 1300 of FIG. 13 on an exemplary FPGA 1500. For simplicity, FPGA 1500 includes an eight by twelve array of CLBs, each CLB including two slices 1400. Virtex FPGAs are larger than FPGA 1500, however, the smallest Virtex FPGA having a sixteen by twenty-four array of CLBs.

When test circuit 1300 is instantiated on a Virtex FPGA, each minor test, circuit 1205(1–N)—detailed in FIG. 12—occupies four CLBs, leaving only a single unused LUT for every four CLBs. Columns of test circuits 1205(1–N) are connected together to form column instance 1210(1–M), also detailed in FIG. 12. An exemplary test circuit 1205(1) and an exemplary column instance 1210(3) are labeled in FIG. 15A. The unused LUTs from the test circuits can then be configured to implement other circuits, if desired, such as clock generator 310, clock-pulse generator 810, XNOR gate 920, OR gate 1320, AND gate 1325, and AND gate 1330.

Figure 16:
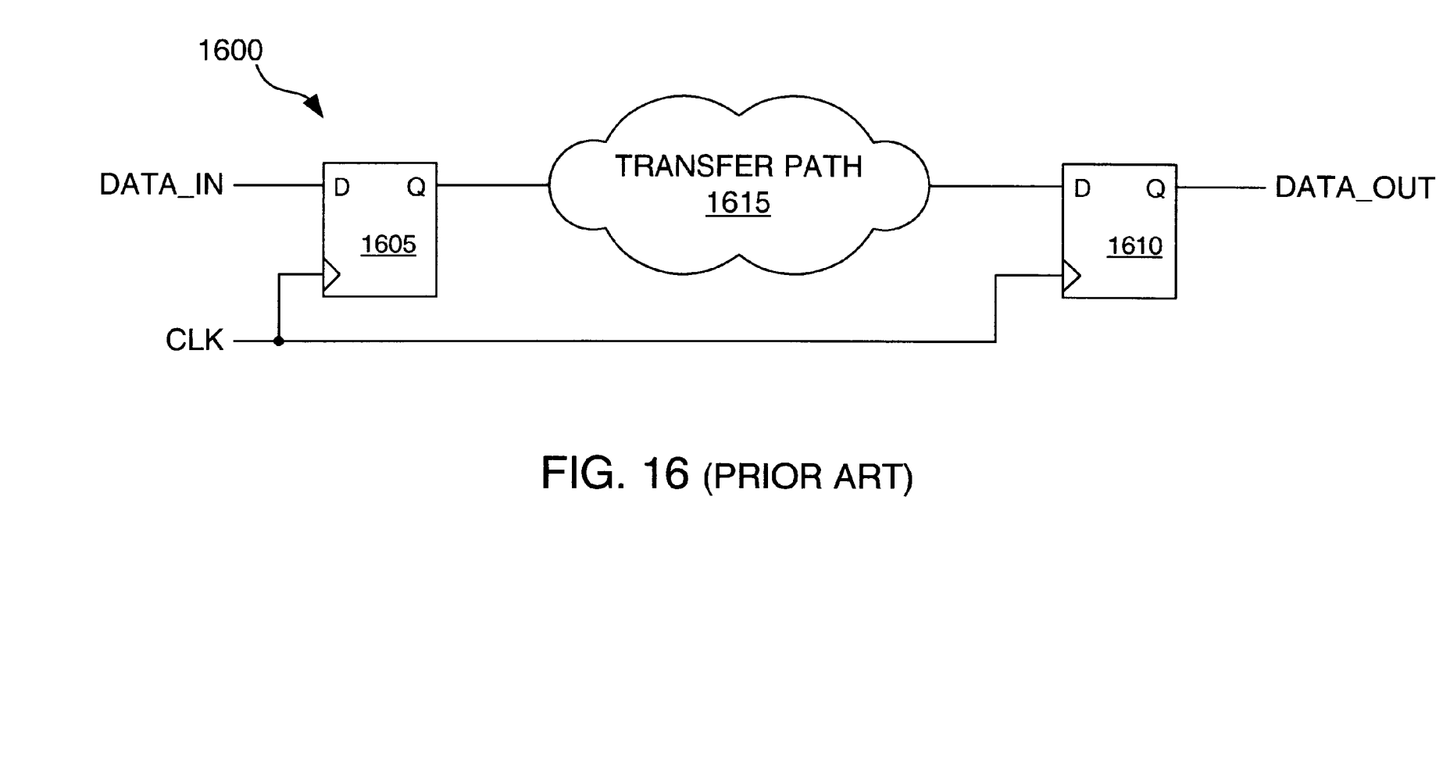
FIG. 16 (prior art) depicts a pair of sequential storage elements 1605 and 1610 interconnected via an exemplary register transfer path 1615.

The four configurations of FIGS. 15A–15D together provide 100% test coverage of all CLB flip-flops and LUT RAMs. However, populating an FPGA with these test circuits does not test the myriad potential routing paths between registers, conventionally referred to as "register transfer paths." FIG. 16 (prior art) depicts a pair of sequential storage elements 1605 and 1610 interconnected via an exemplary register transfer path 1615. Transfer path 1615 includes routing resources and possibly combinatorial and/or sequential logic. Fortunately, verifying the correct operation of the various memory elements also verifies the operation of the register transfer paths used to interconnect those elements. The present invention can therefore be extended to test routing resources.

Testing routing resources in accordance with the invention is an iterative process. The test circuits described above are run a number of times, in each case employing a different set of interconnect resources. Those of skill in the art are familiar with the process of rerouting designs to use different routing resources in an effort to test those resources.

Virtex FPGAs are fully compliant with the IEEE Standard 1149.1 Test Access Port and Boundary-Scan Architecture, commonly referred to as the "JTAG standard," or simply "JTAG." Using JTAG, FPGA resources can be field tested by importing a serial stimulus vector to program the FPGA to include the above-described test circuitry. Then, as described above, the test circuitry can be run at speed to determine whether the resources occupied by the test circuitry function properly at speed. The present invention therefore provides an effective field diagnostic tool that can be used to test FPGAs in a user's system.

While the present invention has been described in connection with specific embodiments, variations of these embodiments will be obvious to those of ordinary skill in the art upon review of the present specification. For example, the test circuits described above can be implemented within IOBs to test IOB resources. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A circuit for testing a plurality of uniquely addressed memory elements in a random-access memory (RAM), the circuit comprising:
   a. a circuit clock terminal;
   b. a first counter having:
      i. a first counter input terminal connected to the circuit clock terminal; and
      ii. a first plurality of counter output terminals;
   c. a first linear-feedback shift register including the RAM and having:
      i. a first RAM clock terminal connected to the circuit clock terminal;
      ii. a plurality of address terminals connected to respective ones of the first plurality of counter output terminals;
      iii. a data input terminal adapted to receive data to be stored in an addressed one of the memory elements; and
      iv. a RAM output terminal adapted to provide data stored in the addressed memory element; and
   d. a comparator having a first comparator input terminal connected to the RAM output terminal, a second comparator input terminal adapted to receive a reference number, and a comparator output terminal.

2. The circuit of claim 1, wherein the comparator is adapted to provide an error signal on the comparator output terminal if a signal on the first comparator input terminal differs from a signal on the second comparator input terminal.

3. The circuit of claim 1, wherein the RAM resides on a programmable logic device.

4. The circuit of claim 3, wherein the programmable logic device includes programmable routing resources, and wherein a portion of the programmable routing resources connects the RAM output terminal to the first comparator input terminal.

5. The circuit of claim 3, wherein the RAM comprises a configurable look-up table.

6. The circuit of claim 1, further comprising a clock generator having an output terminal connected to the circuit clock terminal.

7. The circuit of claim 1, further comprising a second linear-feedback shift register, wherein the second linear-feedback shift register generates the reference number.

8. The circuit of claim 7, wherein the second linear-feedback shift register includes a plurality of address terminals connected to respective ones of the plurality of counter output terminals.

9. The circuit of claim 7, wherein the comparator includes a comparator clock terminal connected to the circuit clock terminal, and wherein the comparator is adapted to provide an error signal on the comparator output terminal if a signal on the first comparator input terminal differs from a signal on the second comparator input terminal after each of a sequence of clock transitions on the circuit clock terminal.

10. The circuit of claim 7, wherein the second linear-feedback shift register includes a second RAM clock terminal connected to the circuit clock terminal.

11. The circuit of claim 7, further comprising a second counter having a second plurality of counter output terminals, wherein the second linear-feedback shift register includes a plurality of address terminals connected to respective ones of the second plurality of counter output terminals.

12. The circuit of claim 1, further comprising a signature analyzer connected to the RAM output terminal.

13. The circuit of claim 12, wherein the signature analyzer comprises a second linear-feedback shift register having a clock terminal connected to the RAM output terminal of the first linear-feedback shift register.

14. The circuit of claim 1, wherein the first counter comprises a second linear-feedback shift register.

15. The circuit of claim 14, wherein the first counter comprises additional RAM to be tested.

16. The circuit of claim 1, wherein the shift register further comprises a flip-flop having a data input connected to the RAM output terminal.

17. The circuit of claim 1, wherein the shift register further comprises a write-enable terminal connected to one of the counter output terminals.

18. The circuit of claim 1, wherein the shift register further comprises a clock-enable terminal connected to one of the counter output terminals.

19. A method of testing sequential storage elements in a programmable logic device (PLD), the method comprising:
   a. configuring the PLD to include an LFSR in one region of the PLD, the LFSR including the sequential storage elements;
   b. presetting the LFSR to store a known value;
   c. clocking the LFSR through a number of shift cycles to obtain a final stored value in the sequential storage elements;
   d. compiaring the final stored value with a final reference value; and
   e. if the final stored value matches the final reference value, reconfiguring the one region to perform a combinatorial logic function.

20. The method of claim 19, wherein the PLD comprises a plurality of configurable logic blocks, the method further comprising using each of the configurable logic blocks to instantiate at least one LFSR.

21. The method of claim 19, further comprising comparing an intermediate stored value in the sequential storage elements with an intermediate reference value after each shift cycle.

22. The method of claim 19, wherein the clocking occurs at a first clock rate, the method further comprising reducing the first clock rate to a second clock rate if the final stored value does not match the final reference value.

23. The method of claim 22, further comprising repeating steps a through e at the second clock rate.

24. The method of claim 19, wherein the sequential storage elements comprise random-access memory.

25. The method of claim 19, wherein the PLD includes configurable routing resources, and wherein configuring the PLD to include an LFSR includes configuring the routing resources to define a first collection of register transfer paths between ones of the sequential storage elements.

26. The method of claim 25, further comprising configuring the PLD to include a second LFSR in the one region of the PLD, the LFSR including the sequential storage elements.

27. The method of claim 26, wherein configuring the PLD to include the second LFSR includes configuring the routing resources to define a second collection of register transfer paths between ones of the sequential storage elements.

28. The method of claim 27, further comprising repeating steps b through e to test the second collection of register transfer paths.

29. A circuit for testing programmable storage elements of a programmable logic device, the circuit comprising:
   a. a circuit clock terminal;
   b. a linear-feedback shift register including the storage elements and having:
      i. a register clock terminal coupled to the circuit clock terminal;
      ii. a data input terminal adapted to receive data to be stored in one of the storage element; and
      iii. a register output terminal adapted to provide data stored in the one storage element; and
   c. a comparator having a first comparator input terminal connected to the register output terminal, a second comparator input terminal connected to receive a reference number, and a comparator output terminal.

30. The circuit of claim 29, wherein the comparator is adapted to provide an error signal on the comparator output terminal if a signal on the first comparator input terminal differs from a signal on the second comparator input terminal.

31. The circuit of claim 29, wherein the programmable logic device includes programmable routing resources, and wherein a portion of the programmable routing resources connects the register output terminal to the first comparator input terminal.

32. The circuit of claim 29, wherein the storage elements comprise a configurable look-up table.

* * * * *